United States Patent
Chen et al.

(10) Patent No.: US 9,442,133 B1
(45) Date of Patent: Sep. 13, 2016

(54) EDGE ELECTRODE FOR CHARACTERIZATION OF SEMICONDUCTOR WAFERS

(71) Applicants: Dong Chen, Tucson, AZ (US); Bryan Guenther, Tucson, AZ (US); Henry Fagg, Tucson, AZ (US); Jaime Duran, Tucson, AZ (US)

(72) Inventors: Dong Chen, Tucson, AZ (US); Bryan Guenther, Tucson, AZ (US); Henry Fagg, Tucson, AZ (US); Jaime Duran, Tucson, AZ (US)

(73) Assignee: BRUKER NANO INC., Santa Barbara, CA (US)

(*) Notice: Subject to any disclaimer, the term of this patent is extended or adjusted under 35 U.S.C. 154(b) by 444 days.

(21) Appl. No.: 13/895,654

(22) Filed: May 16, 2013

Related U.S. Application Data

(63) Continuation-in-part of application No. 13/715,486, filed on Dec. 14, 2012, now Pat. No. 9,176,167, and a continuation-in-part of application No. 13/332,657, filed on Dec. 21, 2011, now Pat. No. 9,057,757.

(60) Provisional application No. 61/525,770, filed on Aug. 21, 2011.

(51) Int. Cl.
| | |
|---|---|
| *G01R 1/06* | (2006.01) |
| *G01R 31/44* | (2006.01) |
| *G01R 31/26* | (2014.01) |
| *G01R 31/02* | (2006.01) |
| *G09G 3/00* | (2006.01) |
| *G01R 1/073* | (2006.01) |

(52) U.S. Cl.
CPC ............... *G01R 1/06* (2013.01); *G01R 1/073* (2013.01); *G01R 31/025* (2013.01); *G01R 31/2635* (2013.01); *G01R 31/44* (2013.01); *G09G 3/006* (2013.01)

(58) Field of Classification Search
CPC .... G01R 1/0408; G01R 1/073; G01R 31/44; G01R 31/2635; G01R 31/025; G09G 3/006
USPC .......................................................... 324/414
See application file for complete search history.

(56) References Cited

U.S. PATENT DOCUMENTS

| | | | | |
|---|---|---|---|---|
| 4,216,484 | A * | 8/1980 | Hasegawa | H01L 33/0025 257/103 |
| 4,426,339 | A * | 1/1984 | Kamath | H01C 7/027 219/549 |
| 4,621,232 | A * | 11/1986 | Chang | G01R 1/073 324/754.22 |
| 4,866,253 | A * | 9/1989 | Kamath | H05B 3/146 219/528 |
| 4,876,440 | A * | 10/1989 | Kamath | H05B 3/146 219/528 |
| 5,873,161 | A * | 2/1999 | Chen | H01L 23/5385 257/E23.172 |
| 6,211,690 | B1 * | 4/2001 | Fjelstad | G01R 1/07328 324/754.18 |

(Continued)

*Primary Examiner* — Jermele M Hollington
*Assistant Examiner* — Christopher McAndrew
(74) *Attorney, Agent, or Firm* — Antonio R. Durando

(57) ABSTRACT

A conductive conformable braided wire is used as the edge electrode for material characterization of a semiconductor wafer. The braided wire is adapted to contact the perimeter of the n-GaN layer using a retractable support structure that alternately places the electrode in contact with the edge of the n-GaN layer and retracts it during repeated cycles of operation to test a plurality of similar wafers. The braided wire produced a very stable and higher electrical contact than any prior-art edge electrode.

12 Claims, 8 Drawing Sheets

(56) References Cited

U.S. PATENT DOCUMENTS

| | | | | |
|---|---|---|---|---|
| 6,492,629 | B1* | 12/2002 | Sopory | H05B 1/0205 219/485 |
| 6,720,787 | B2* | 4/2004 | Kimura | H01R 13/2414 29/884 |
| 6,906,541 | B2* | 6/2005 | Kimura | G01R 1/07328 324/763.01 |
| 6,969,622 | B1* | 11/2005 | Kokubo | H01R 13/2414 324/750.05 |
| 7,425,250 | B2* | 9/2008 | Basol | B23H 5/08 204/198 |
| 7,521,665 | B2* | 4/2009 | Reichinger | G01L 1/242 250/214 R |
| 7,629,798 | B2* | 12/2009 | Mallory | H01L 21/67265 324/686 |
| 7,859,267 | B2* | 12/2010 | Andresen | G01R 31/44 315/291 |
| 2002/0175695 | A1* | 11/2002 | Ahmann | G01R 1/07314 324/750.16 |
| 2004/0012383 | A1* | 1/2004 | Kimura | G01R 1/07328 324/763.01 |
| 2006/0134378 | A1* | 6/2006 | Kimura | H01R 43/007 428/137 |
| 2006/0176064 | A1* | 8/2006 | Kimura | G01R 1/07314 324/691 |
| 2007/0139061 | A1* | 6/2007 | Eldridge | G01R 1/18 324/750.27 |
| 2008/0072422 | A1* | 3/2008 | Levante | H01R 12/57 29/852 |
| 2008/0242128 | A1* | 10/2008 | Hilty | H01R 13/2414 439/91 |
| 2008/0290881 | A1* | 11/2008 | Mallory | H01L 21/67265 324/690 |
| 2009/0115444 | A1* | 5/2009 | Okuda | H01R 13/03 324/762.01 |
| 2011/0043234 | A1* | 2/2011 | Lee | G01R 1/0466 324/755.09 |

* cited by examiner

EDGE ELECTRODE FOR CHARACTERIZATION OF SEMICONDUCTOR WAFERS

RELATED APPLICATIONS

This application is a continuation-in-part application of U.S. Ser. No. 13/715,486, filed Dec. 14, 2012, and of U.S. Ser. No. 13/332,657, filed Dec. 21, 2011, both of which were based on and claimed the priority of U.S. Provisional Application Ser. No. 61/525,770, filed Aug. 21, 2011.

BACKGROUND OF THE INVENTION

1. Field of the Invention

This invention pertains to the general field of testing of semiconductor materials. In particular, it pertains to an improvement in the edge electrode of the instrument used for characterizing the properties of electroluminescent semiconductor wafers.

2. Description of the Prior Art

The characterization of semiconductor materials and in particular light-emitting semiconductor structures at the wafer-level (i.e., after forming the p-n junction and the active quantum well layers, but prior to the chip processing steps) is typically carried out with a non-destructive wafer probe and an n-layer contact edge electrode coupled to the wafer. The conductive probe is temporarily placed in contact with the top of the epi-wafer (p-GaN) layer while the n-electrode contacts the n-GaN layer through either the edge of the wafer or through other means that allow access to the n-GaN layer. Such typical layout is illustrated in FIG. 1. When energized, the conductive probe, the semiconductor p-n junction structure on the wafer and the n-electrode form a temporary light-emitting device. By injecting a known current into the junction, light will emit from the device and the spectral properties and their relationship with the electrical properties of the wafer can be measured and characterized.

Although the method of using conductive electrodes in contact with respective layers of the semiconductor wafer for measurements and tests has been known for some time in the field, the issues of making good, consistent electrode-wafer contact with repetitive results have remained problematic challenges that vary from application to application. For example, for light-emitting wafer testing, a well-defined uniform contact area between the probe and the p-layer (GaN) with minimal contact resistance is essential. Therefore, the probe material should be stable under a variety of electrical drive conditions.

One major challenge has been the precise estimation and consistent repetitiveness of the true contact area between the probe and the surface of the wafer, which affect conductivity and all related measurement parameters. A hard metallic probe would be ideal for perfectly flat and smooth surfaces because of the high and uniform conductivity of metals. However, the surface of wafers is typically not perfectly smooth, but it contains a degree of roughness sufficient to create non-uniformities in the way the probe contacts the wafer. Therefore, different probes with softer and elastic tips have been used to cause the probe to deform under pressure and conform to the profile of the wafer's surface. For example, U.S. Pat. No. 7,679,381 (issued to Ma) describes a probe that includes a conductive deformable tip made of elastomer or polymer material and a pressure control that together ensure a good contact with the wafer under test as various measurements are taken across its surface.

Such probes used to improve the uniformity of contact over the test wafer consist of a traditional metallic probe with a conductive silicone tip, such as RTV (Room Temperature Vulcanization) liquid silicone material. Such conductive silicone consists of metallic flakes, typically silver particles, with a nominal diameter in the order of micrometers, dispersed in a silicone carrier that is attached and cured onto the tip of the metal probe. (Depending on the application, other conductive fillers may be used, such as graphite, silver-coated copper, nickel, and so on.) In use, the probe is pressed onto the surface of the wafer, causing its deformable tip to conform to wafer surface irregularities, thereby providing a substantially uniform contact throughout.

While the conductive silicone tip used on a spring-loaded probe as described above produced significant improvements over conventional metallic and other soft-tip probes, certain problems remained unsolved. For instance, when the conductive silicone tip is pressed against the wafer surface, even a very smooth surface, each metal flake incorporated in the silicone tends to make a point contact with the wafer and only silicone material contacts the areas surrounding the points of contact. Thus, while the quality of the contact is uniform in a coarse sense, it is very non-uniform in a microscopic sense and, the conductivity of silicone being negligible in comparison to that of metal, hot spots tend to form in point-contact areas.

As disclosed in U.S. Ser. No. 13/715,486, this problem was addressed and essentially solved by adding a distal metallic layer of micrometer-size particles to an intermediate layer of conformable conductive elastomer material attached to a metallic pin. The resulting probe was able to conduct higher and more uniform currents, with no hot spots and minimal parameter drift during testing.

However, while the above described improvement in the probe produced very consistent and repeatable results from measurements carried out at a given probe location on the surface of the wafer, the results of the measurements varied from different probe locations as a function of the distance between the probe and the n-contact edge electrode. As one skilled in the art will readily understand, the electrical resistance of the wafer's n-GaN layer will depend on the distance between the location of the probe on the surface of the wafer and the point of contact of the edge electrode. As illustrated in FIG. 2, clearly the further the placement of the probe from the edge electrode, the higher the resistance, thereby rendering the measurement results subject to errors related to probe location.

Assuming that M edge electrodes are used with the probe at the center of the wafer, as illustrated in FIG. 3, if the resistance along the n-layer path between the probe and any of the edge electrodes is r, the total resistance R will be approximately equal to r/M (based on the basic formula for parallel-circuitry resistance). Therefore, it is clear that increasing the number of N contact points will significantly reduce the influence of the n-GaN layer resistance on the measurement of a wafer.

Based on this observation, various continuous edge contacts have been developed and tested in an attempt to provide n-GaN layer contact along essentially the entire perimeter of the wafer. However, the uniformity of the contact along the edge remained a problem. The present invention describes a new structure for an edge electrode that provides the uniform conductivity required for reliable and repeatable light-emitting semiconductor wafer testing.

BRIEF SUMMARY OF THE INVENTION

The invention lies in the realization that a substantially continuous edge electrode in contact with most of the perimeter of the wafer being tested provides improved repeatable results by reducing the influence of the n-GaN layer resistance on the measurement of a wafer. In addition, the discovery that braided metallic wire is a suitable electrode material for electrical connection with the wafer solved the problem of wear and tear that renders other materials undesirable for the thousands of measurement cycles required for industrial quality-control applications.

Thus, the invention consists of a conductive conformable electrode adapted to contact the perimeter of the n-GaN layer of the semiconductor material, typically a circular wafer. A retractable support structure is used alternately to place the electrode in contact with the n-GaN layer of the wafer and to retract it during repeated cycles of operation. The electrode is electrically connected to a power source in conventional manner in an instrument for testing semiconductor material.

In the preferred embodiment, the electrode is a conductive braided wire, preferably a nickel-coated copper wire. The support structure includes four arc sections mechanically coupled to respective segments of braided wire, so as to cover most of the perimeter of the wafer when the sections are clamped to position the segments of braided wire in contact with the edge of the wafer. Each segment of electrode is electrically connected to the power source.

Various other aspects and advantages of the invention will become clear from the description that follows and from the novel features particularly recited in the appended claims. Therefore, to the accomplishment of the objectives described above, this invention consists of the features hereinafter illustrated in the drawings, fully described in the detailed description of the preferred embodiments, and particularly pointed out in the claims. However, such drawings and description disclose only some of the various ways in which the invention may be practiced.

DETAILED DESCRIPTION OF THE INVENTION

Figure 1:
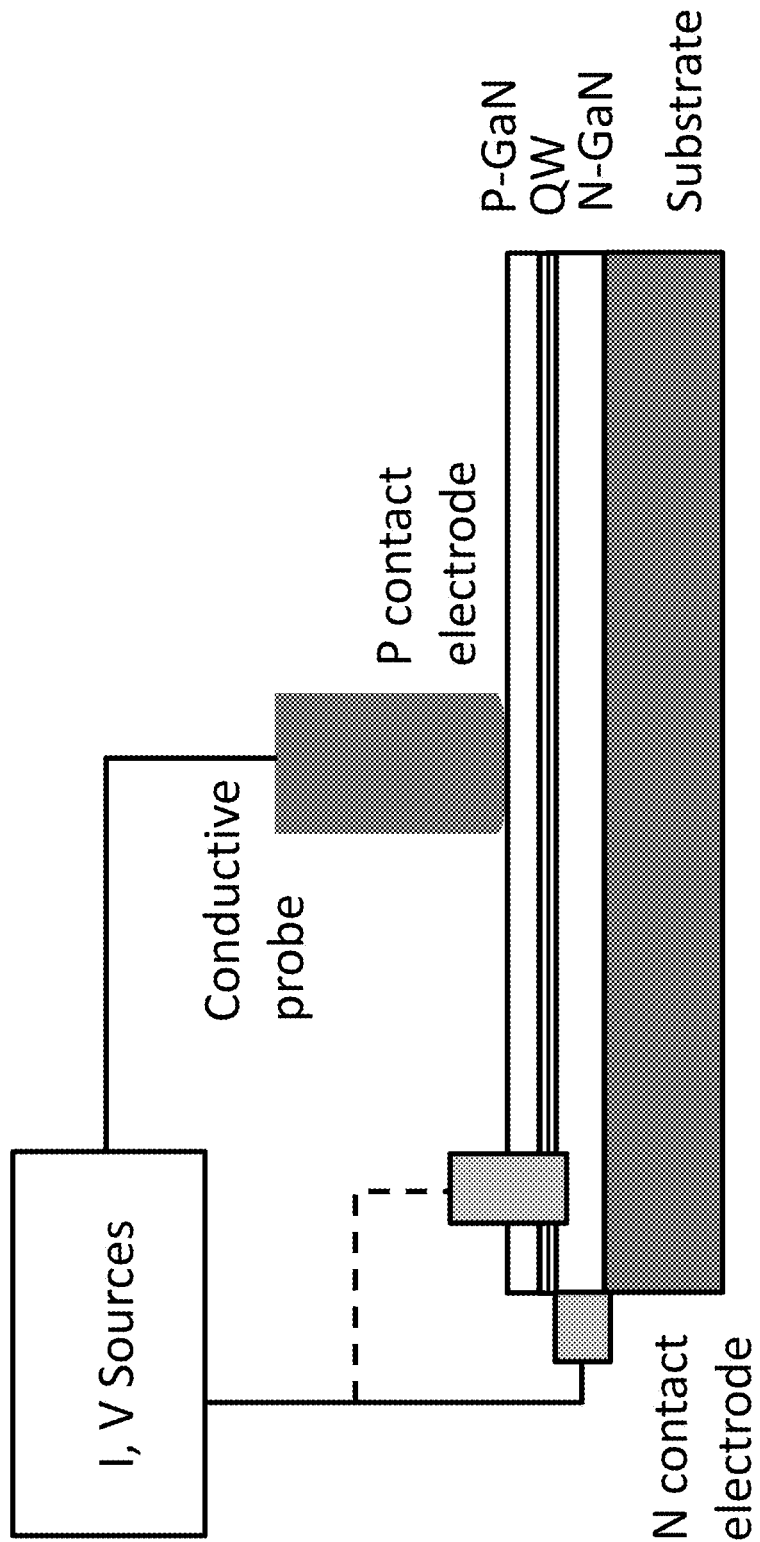
FIG. 1 is a schematic illustration of a conventional instrument used for testing light-emitting semiconductor wafers.
Figure 2:
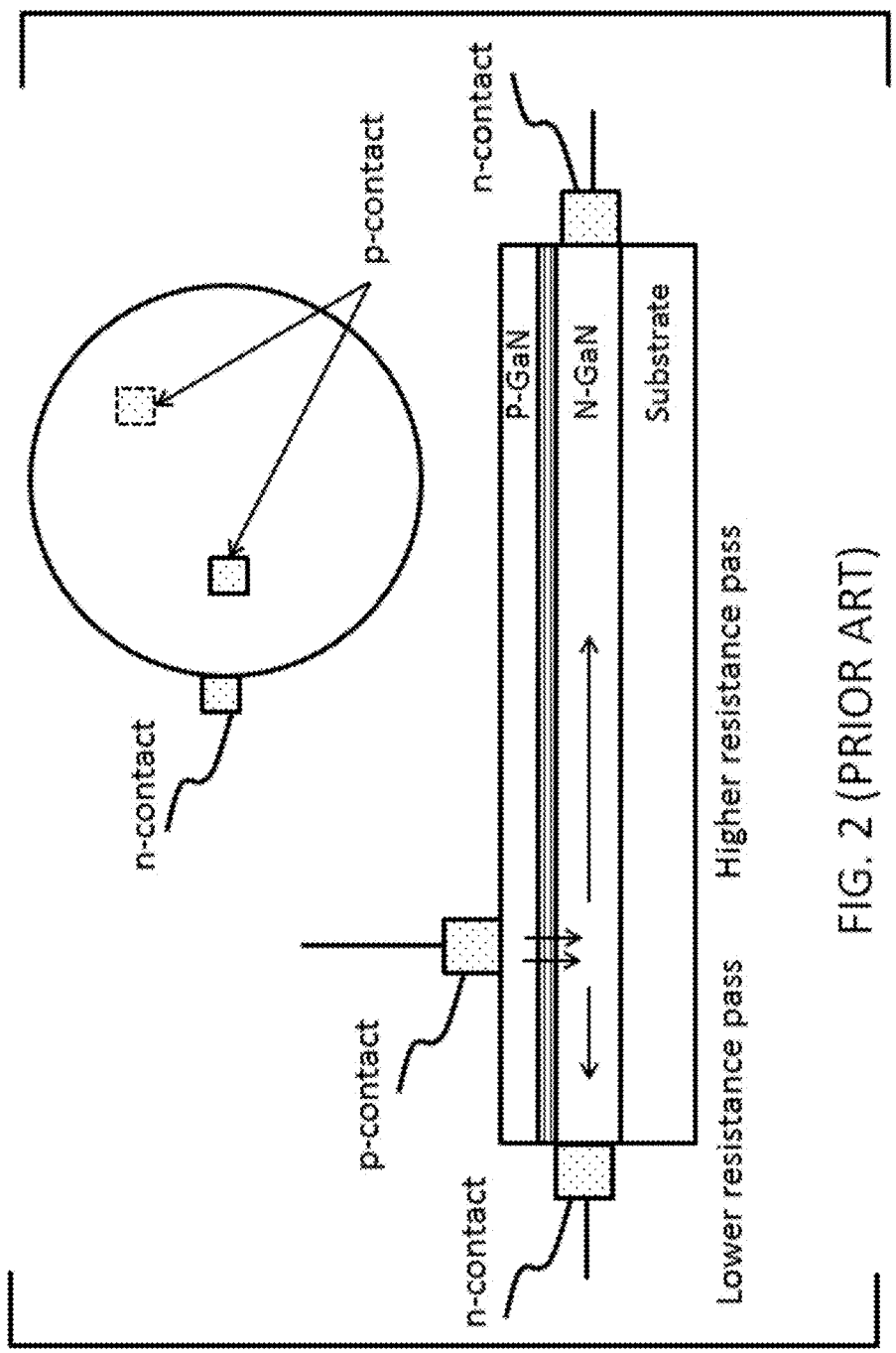
FIG. 2 illustrates the resistance path in the n-GaN layer of a light-emitting semiconductor wafer when current flows between the probe and the edge electrode.
Figure 3:
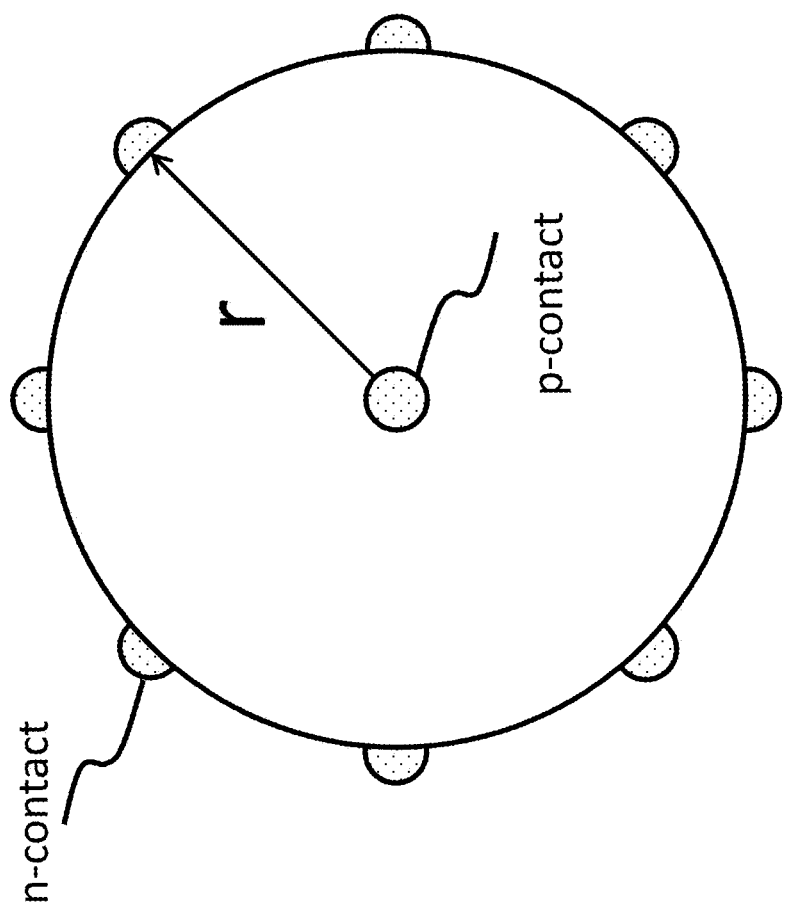
FIG. 3 illustrates in plan schematic view multiple n-GaN layer edge electrodes distributed uniformly around the perimeter of the semiconductor wafer.
Figure 4:
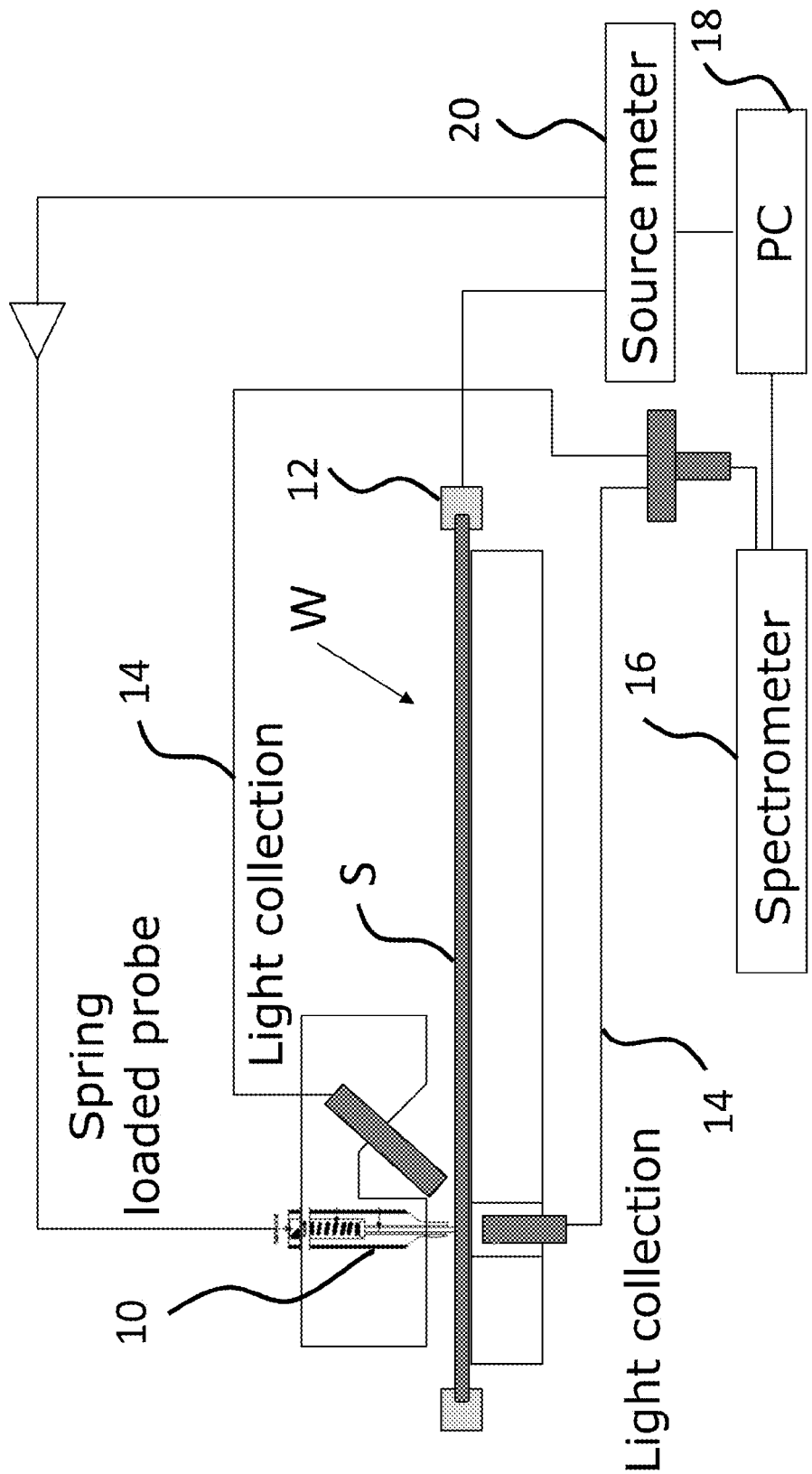
FIG. 4 illustrates a probe station suitable for conducting light-emitting epi-wafer characterization with the edge electrode of the invention.

FIG. 4 illustrates a probe station for light-emitting epi-wafer material characterization using a conducting probe of the type described in Ser. No. 13/715,486. The spring-loaded probe 10 is used as the anode electrode. The probe is engaged to the surface S of the wafer W and makes contact with the p-GaN layer. The loading force applied to the probe for contacting the wafer is controlled by a spring-loaded mechanism acting on the probe 10 and by controlling the distance between the probe mount and the wafer surface. The n-contact of the cathode 12 is made at the side edge of the wafer so that the n-GaN layer can be accessed. The two electrodes 10,12 together with the epi-wafer form a temporary LED structure. When current is injected into the wafer from the probe 10, luminescence under the probe occurs and the emitted light is collected from sensors both in the front and back sides of the wafer through optical fibers 14 and a spectrometer 16. The data output of the spectrometer is acquired by a computer processor 18 for analysis and display. A power source 20 controls the level of current injected into the wafer W. The measurements are made on the sample surface by moving the probe or the sample sequentially between locations of interest. After one or a series of measurements have been taken at a location, a stage (not shown) moves the sample or the probe to the next sample location for the next measurement.

Figure 5:
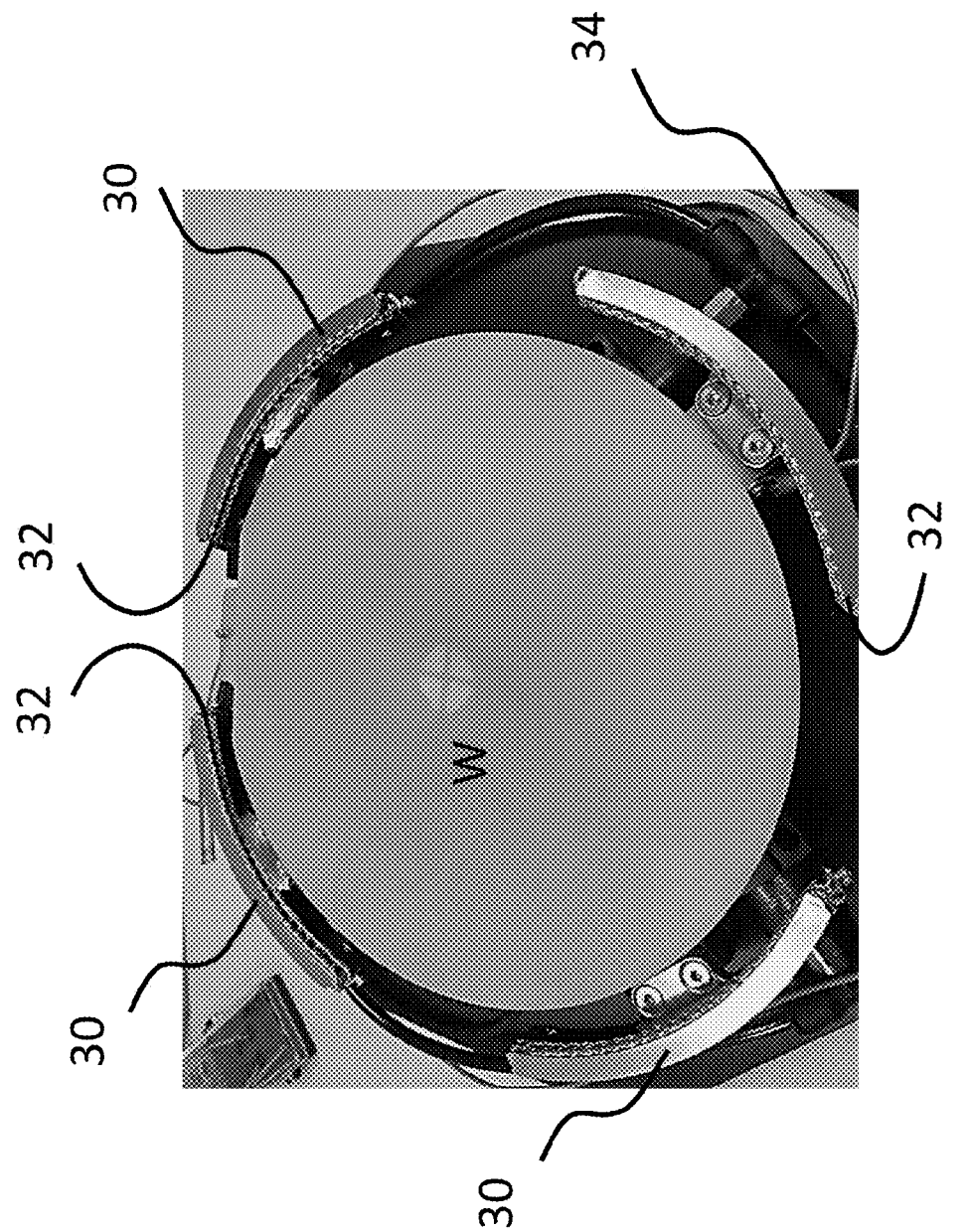
FIG. 5 is an illustration of a clamp system for contacting continuous sections of edge electrode with the n-GaN layer of a circular wafer.
Figure 6:
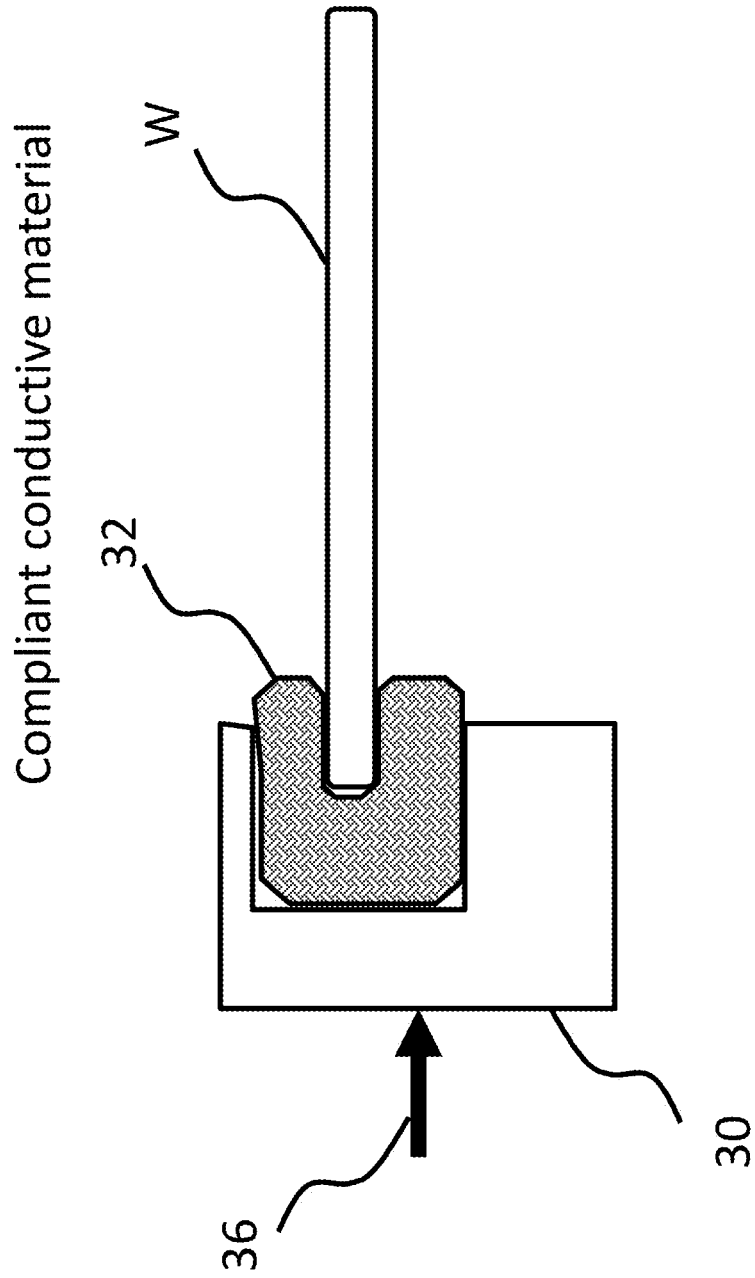
FIG. 6 is a schematic section of the retractable clamp of FIG. 5 used for pressing each portion of edge electrode against the n-GaN layer of the wafer.

The invention is a novel edge electrode that contacts a large portion of the edge along the perimeter of the wafer. A fixture with several clamps is preferably used to press separate portions of the edge electrode against the edge of the wafer so as to cover as much as possible of the n-GaN layer for a substantially continuous contact. As illustrated in the perspective view of FIG. 5 and the cross-section of FIG. 6, a circular wafer W can be covered, for example, by four retractable arc sections 30, each containing a segment of edge electrode 32 connected to the power source 20 by means of respective wires 34 (see also FIG. 4). The sections 30 are moved simultaneously toward the center of the wafer W to contact the n-layer at the edge of the wafer, thereby making electrical contact with the n-layer along substantially the entire perimeter of the wafer. As illustrated schematically in FIG. 6, each retractable section 30 is supported by a frame (not shown), which may also be used to hold the wafer W, and is actuated by a mechanism 36 that produces contact of the electrode segments 32 with the n-GaN layer of the wafer W.

In order to maximize the uniformity of contact between the edge electrodes 32 and the n-GaN layer of the wafer W, many different kinds of compliant materials were tested under various degrees of pressure with the objective of producing as uniform a contact as possible, as measured by the conductivity of the electrode. Copper proved not to conform uniformly along the edge of the wafer, thereby producing uneven conductivity. A conductive elastomer of the kind used in the probe described in Ser. No. 13/715,486 produced uniform conductivity but after a while it chafed and shed particles of elastomer due to the sharp edges of the wafer. Therefore, though excellent in its electrical performance, it proved unsuitable for the many cycles of operation required for quality-control wafer testing.

Another approach was to use metallic (copper) comb-shaped electrodes with tines pointed toward the center of the wafer. The idea was to be able to control the spatial distribution of the contact points by providing the appropriate tine spacing. These electrodes worked well in each instance but the results were not reliably repeatable because the tines tended to deform rapidly and make non-uniformly distributed contact with the wafer. The approach was improved by the use of very sharp tines, but still not to the desired level of performance repeatability.

A foam material covered by a wire mesh produced good results because the random distribution of the mesh wires and the uniform pressure exerted through the elastomeric foam provided a better uniformity of contact with the wafer's n-GaN layer. However, this electrode also proved to be less than desirable for commercial applications because metal particles began to separate from the mesh after repeated measurements.

Figure 7:
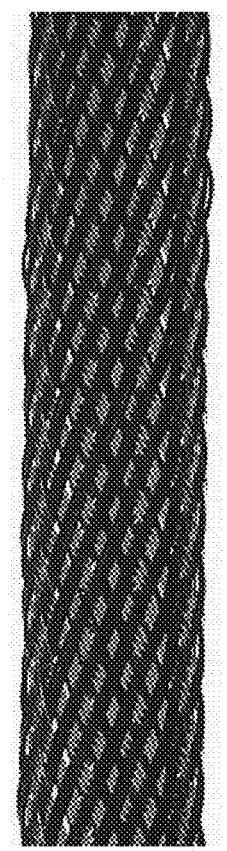
FIG. 7 illustrates the braided wire of the invention as deformed by clamping to the edge of a wafer of EL semiconductor material.
Figure 7:
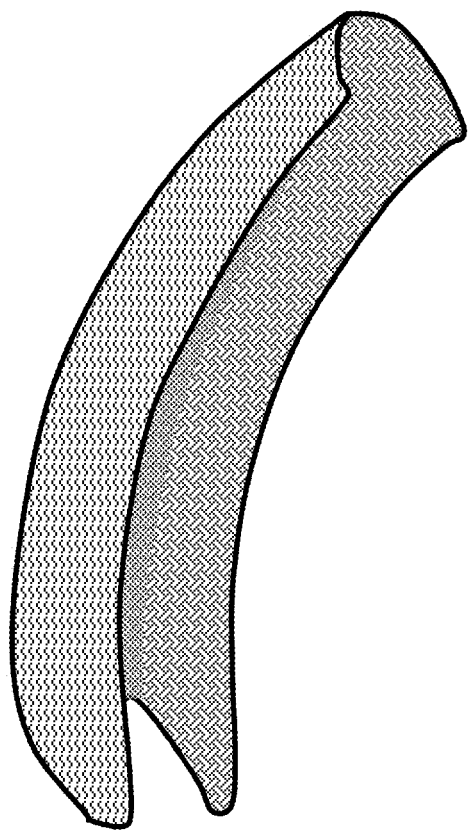

The problem was finally solved using a braided wire of the type normally used as ground cable for electrical applications. For the purposes of this description of the invention, as claimed, the term "braided" is defined as made by interwining three or more strands, as illustrated in FIG. 7. The outcome was surprising because a certain amount of resilience in the electrode material was considered necessary in order to guarantee the same degree of uniform contact during repetitive measurements. However, it appears that the braided geometry of such wire allows it to curl around the edge of the wafer while conforming to the n-GaN layer through a deformation that remains in place, substantially unchanged, between measurements. As a result, subsequent measurements are repeatable over literally thousands of cycles. Because of the braided structure of the wire and the relatively large size of the individual strands, very few metal particles are shed over long periods of usage and a very high degree of contact is achieved. A remarkably improved performance was obtained using the braided nickel-coated copper wire sold by American Grounding System, Inc., of Toledo, Oreg., as Part Number AGS-02-171/1NPC.

Figure 8:
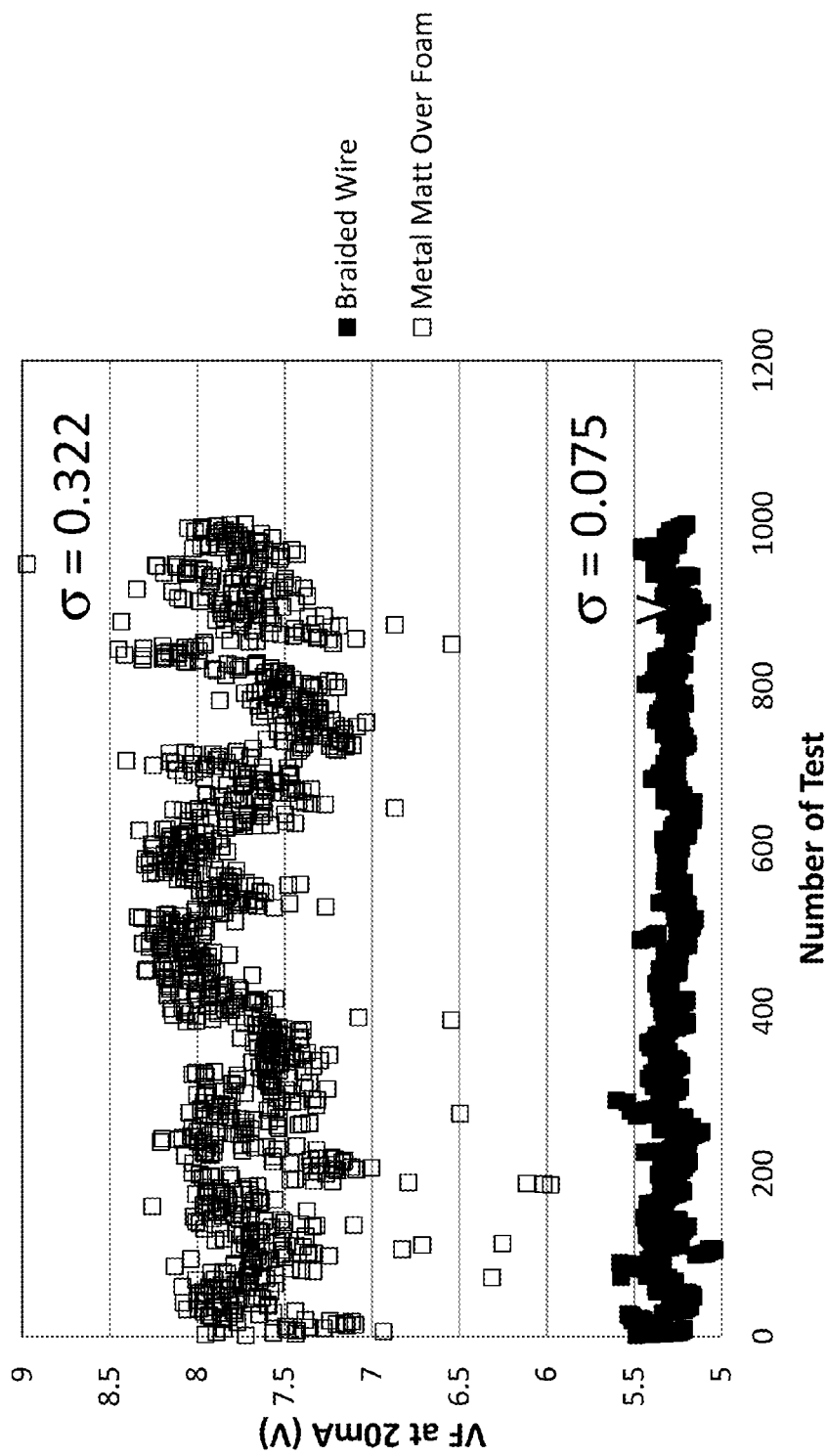
FIG. 8 shows a comparison between a braided wire electrode according to the invention and a metal-matt-over-foam electrode.

FIG. 8 shows a comparison between a braided wire (BW) electrode according to the invention and a metal-matt-over-foam (MMOF) electrode. The data show the voltages measured at 20 mA. The average voltages for the BW and MMOF electrodes were 5.3V and 7.7V, respectively, indicating a better conductive contact of the BW electrode. The standard deviations were 0.075V and 0.322V for the BW and MMOF electrodes, respectively, indicating a much improved repeatability of BW electrode of the invention.

Thus, it is clear that the use of a braided-wire electrodes clamped over a large portion of the perimeter of the wafer (at least 60 percent was used during the tests that yielded the results of FIG. 8) produced a very stable and higher contact with the n-GaN layer of the wafer than any prior-art edge electrode. The combination of this type of edge n-electrode with the p-electrode probe described in co-owned Ser. No. 13/715,486 has essentially solved all problems associated with industrial quality-control testing of electroluminescent semiconductor wafers.

Various changes in the details that have been described may be made by those skilled in the art within the principles and scope of the invention herein illustrated and defined in the appended claims. For example, the invention has been described in the context of a circular wafer and correspondingly clamps in the shape of arc sections, but it is clear that the same approach could be used with any a wafer of different shape by using similarly shaped clamps adapted to press the electrode against the edge of the wafer. Similarly, instead of retractable clamps, a jaw arrangement could be used whereby the electrical connection is achieved by bringing the wafer into contact with the jaws. Also, the invention was developed for testing an electroluminescent semiconductor material, but it can be used in equivalent manner to test other semiconductor materials. Thus, while the invention has been shown and described in what are believed to be the most practical and preferred embodiments, it is recognized that departures can be made therefrom within the scope of the invention, which is not to be limited to the details disclosed herein but is to be accorded the full scope of the claims so as to embrace any and all equivalent apparatus and methods.

The invention claimed is:

1. A conductive edge electrode for characterizing a semiconductor material, comprising:
   a conductive conformable electrode adapted to contact a perimeter of a layer of the semiconductor material; and
   a support structure adapted to place the electrode in contact with said layer and to separate the electrode from the layer for repeated cycles of operation with a plurality of samples;
   wherein, during each of said repeated cycles of operation, said contact of the electrode is stationary in relation to the layer of semiconductor material.

2. The electrode of claim 1, wherein said semiconductor material is an electroluminescent material.

3. The electrode of claim 1, wherein said electrode comprises a braided wire.

4. The electrode of claim 3, wherein said braided wire includes nickel-coated copper material.

5. The electrode of claim 3, wherein said semiconductor material is a circular wafer and said support structure includes four arc sections, each of said sections being mechanically coupled to a segment of said conductive braided wire.

6. The electrode of claim 3, wherein said semiconductor material is an electroluminescent material.

7. A method of producing an electrical contact between an electrode and a layer of a semiconductor material for characterizing the material, comprising the following steps:
   providing a conductive conformable electrode adapted to contact a perimeter of the layer of the semiconductor material; and
   alternately placing the electrode in contact with said layer and separating the electrode from the layer for repeated cycles of operation with a plurality of samples;
   wherein, during each of said repeated cycles of operation, said contact of the electrode is stationary in relation to the layer of semiconductor material.

8. The method of claim 7, wherein said semiconductor material is an electroluminescent material.

9. The method of claim 7, wherein said electrode comprises a braided wire.

10. The method of claim 9, wherein said braided wire includes nickel-coated copper material.

11. The method of claim 9, wherein said semiconductor material is a circular wafer and said clamping step is carried out with a support structure that includes four arc sections, each of said sections being mechanically coupled to a segment of said conductive braided wire.

12. The method of claim 9, wherein said semiconductor material is an electroluminescent material.

* * * * *